(12) United States Patent
Crols et al.

(10) Patent No.: US 10,389,314 B2
(45) Date of Patent: Aug. 20, 2019

(54) HIGH-VOLTAGE DIGITAL POWER AMPLIFIER WITH SINUSOIDAL OUTPUT FOR RFID

(71) Applicant: PANTHRONICS AG, Graz (AT)

(72) Inventors: Jan Crols, Oud-Heverlee (BE); Steven Gabriels, Tremelo (BE); Jakob Jongsma, Graz (AT)

(73) Assignee: PANTHRONICS AG, Graz (AT)

( * ) Notice: Subject to any disclaimer, the term of this patent is extended or adjusted under 35 U.S.C. 154(b) by 0 days.

(21) Appl. No.: 16/062,419

(22) PCT Filed: Dec. 7, 2016

(86) PCT No.: PCT/EP2016/080047
§ 371 (c)(1),
(2) Date: Jun. 14, 2018

(87) PCT Pub. No.: WO2017/102493
PCT Pub. Date: Jun. 22, 2017

(65) Prior Publication Data
US 2018/0367106 A1    Dec. 20, 2018

(30) Foreign Application Priority Data
Dec. 14, 2015   (EP) .................................... 15199768

(51) Int. Cl.
*H03F 3/20*     (2006.01)
*H03F 3/21*     (2006.01)
(Continued)

(52) U.S. Cl.
CPC ......... *H03F 3/213* (2013.01); *G06K 19/0723* (2013.01); *H03F 3/195* (2013.01);
(Continued)

(58) Field of Classification Search
CPC ............ H03F 3/195; H03F 3/20; H03F 3/211; H03F 3/213; H03F 3/217;
(Continued)

(56) References Cited

U.S. PATENT DOCUMENTS

| | | |
|---|---|---|
| 5,930,128 A | 7/1999 | Dent |
| 2009/0021374 A1* | 1/2009 | Stagg .................. G06K 7/0008 340/572.1 |

(Continued)

FOREIGN PATENT DOCUMENTS

EP    2 736 167 A1    5/2014

OTHER PUBLICATIONS

Int'l Search Report and Written Opinion of the Int'l Searching Authority for Int'l Pat. App. No. PCT/EP2016/080047 dated Mar. 7, 2017, 9 pgs.

(Continued)

*Primary Examiner* — Young T Tse
(74) *Attorney, Agent, or Firm* — Merchant & Gould P.C.

(57) ABSTRACT

A digital power amplifier comprises: an integrated circuit (IC2); an adaption circuit of discrete components connected to first and second transmission output pins of an integrated circuit to adapt the output signal and feed a substantial sinusoidal output current with a transmission resonance frequency to an RFID antenna. IC2 comprises a digital control section with N wave-forming contacts to output a digital wave-forming bit combination of N bits with a clock frequency M-times the transmission resonance frequency; N driver blocks each connected with a first contact to one of the wave-forming contacts and N/2 of them connected with a second contact to the first transmission output pin and the other N/2 of them connected with their second contact to the second transmission output pin. The driver blocks provide (Continued)

increments of the substantial sinusoidal output current to the first and second transmission output pins.

8 Claims, 3 Drawing Sheets

(51) Int. Cl.
   *G06K 19/07* (2006.01)
   *H03F 3/195* (2006.01)
   *H03F 3/213* (2006.01)
   *H03F 3/217* (2006.01)
   *H03M 1/74* (2006.01)

(52) U.S. Cl.
   CPC ............... *H03F 3/20* (2013.01); *H03F 3/211* (2013.01); *H03F 3/217* (2013.01); *H03F 2200/267* (2013.01); *H03F 2200/387* (2013.01); *H03F 2200/451* (2013.01); *H03F 2200/48* (2013.01); *H03M 1/745* (2013.01)

(58) Field of Classification Search
   CPC ......... H03F 2200/267; H03F 2200/387; H03F 2200/451; H03F 2200/48; H03M 1/745; G06K 19/0723; G06K 19/0725
   USPC ........ 375/296, 297, 318, 346; 330/251, 259, 330/288; 340/12.51, 13.26
   See application file for complete search history.

(56) References Cited

U.S. PATENT DOCUMENTS

| | | |
|---|---|---|
| 2014/0218104 A1 | 8/2014 | Kunihiro |
| 2015/0045635 A1* | 2/2015 | Tankiewicz ........ A61B 5/14503 600/309 |
| 2015/0083810 A1* | 3/2015 | Ching ................ G06K 19/0715 235/492 |
| 2016/0338646 A1* | 11/2016 | Lee ...................... A61B 5/6832 |

OTHER PUBLICATIONS

Int'l Preliminary Report on Patentability for Int'l Pat. App. No. PCT/EP2016/080047 dated Apr. 19, 2018, 9 pgs.

* cited by examiner

HIGH-VOLTAGE DIGITAL POWER AMPLIFIER WITH SINUSOIDAL OUTPUT FOR RFID

This application is a National Stage Application of PCT/EP2016/080047, filed 7 Dec. 2016, which claims benefit of Serial No. 15199768.1, filed 14 Dec. 2015 with the European Patent Office, and which applications are incorporated herein by reference. To the extent appropriate, a claim of priority is made to each of the above disclosed applications.

FIELD OF THE INVENTION

The present invention relates to a digital power amplifier to drive an RFID antenna with a substantial sinusoidal output current which digital power amplifier comprises:
an integrated circuit with a first transmission output pin and a second transmission output pin to provide an output signal; and
an adaption circuit of discrete components connected to the first and second transmission output pin to adapt the output signal and feed the substantial sinusoidal output current with a transmission resonance frequency to the RFID antenna.

BACKGROUND OF THE INVENTION

High-voltage digital power amplifiers or class D amplifiers like AMS AS3911 are known and used in radio frequency identification (RFID) devices like RFID readers to communicate with active or passive transponders. In a typical application a passive transponder or tag stores product identification of a product to which it is attached and the reader is used to obtain this product information. The reader is powered and generates a magnetic field emitted by its RFID antenna. When the reader and the tag are within close proximity of each other, the reader generated magnetic field is induced into the RFID antenna of the tag and used to power the passive tag. The tag also has a transceiver to receive the signal from the reader and to transmit a response back to the reader.

There are standards like ISO/IEC18000-3 or ISO/IEC 14.443 Type A and B or ISO15.693 or ECMA-340 13.56 MHz Near Field Communication (NFC) or company standards like Felica from company Sony that define protocols and types of modulation used to transmit information between the tag and the reader. Some or all of these standards define that the reader transmits digital data to the tags as an analogue signal by changing the magnitude of its transmitted power. The high-voltage power amplifier is used to process the digital data in a low voltage (typ. 3.6V or 5V) domain into an amplified analogue signal with the transmission resonance frequency to drive the RFID antenna in resonance to output maximal power of the substantial sinusoidal output current. The substantial sinusoidal output current of the output signal is needed to satisfy the spurious emission levels required by regulations to avoid noise in other frequency ranges.

FIG. 1 shows the transmission part of a state of the art high-voltage digital power amplifier 1 within a reader that comprises an integrated circuit IC1 that processes digital data to be transmitted to a tag. An adaption circuit 2 of discrete components connected to a first transmission output pin 3 and a second transmission output pin 4 to adapt the output signal of the integrated circuit IC1 and to feed a substantial sinusoidal output current I with a transmission resonance frequency to RFID antenna 10. The digital data as output signal of the integrated circuit IC1 are provided as 0 Volt for bit "0" or "low" and 3.6 Volt to 5 Volt for bit "1" or "high" between the first transmission output pin 3 and the second transmission output pin 4 of the integrated circuit IC1. Filter means 5 are connected to the transmission output pins 3 and 4 to filter the rectangular digital output signal into a substantial sinusoidal signal provided at output connections 6 and 7 of the filter means 5. Resonance means 8 are connected to the output connections 6 and 7 of the filter means 5 and an Ohmic resistance 9 is arranged parallel to RFID antenna 10 and connected to output connections 11 and 12 of resonance means 8.

Resonance means 8 transform the signal into the substantial sinusoidal output current I with the transmission resonance frequency of RFID antenna 10 to output maximal power into the magnetic field HF to be received by the tag. The Ohmic resistance 9 forms the load resistor and generates a substantial sinusoidal output voltage U for RFID antenna 10.

Drawback of this known high-voltage digital power amplifier is the high number of discrete components of the adaption circuit 2 connected to integrated circuit IC1 what increases the size and manufacturing costs of the digital power amplifier. It is substantially not possible to integrate these components into the integrated circuit IC1 of the digital power amplifier 1 due to the high inductive reactance needed for inductors L0a and L0b in filter means 5 and the high capacity needed for the capacitors C0a and C0b in filter means 5 and capacitors C1a and C1b in resonance means 8.

SUMMARY OF THE INVENTION

It is an object of the invention to provide a high-voltage digital power amplifier to drive an RFID antenna with a substantial sinusoidal output current with only a limited number of discrete components in the adaption circuit.

This object is achieved with a digital power amplifier with an integrated circuit that comprises:
a digital control section with a number of N wave-forming contacts to output a digital wave-forming bit combination of N bits with a clock frequency M-times the transmission resonance frequency;
a number of N driver blocks each connected with a first contact to one of the wave-forming contacts and a number of N/2 of them connected with a second contact to the first transmission output pin and the other number of N/2 of them connected with their second contact to the second transmission output pin, which driver blocks are built to provide increments of the substantial sinusoidal output current to the first and second transmission output pin.

This design of a digital power amplifier provides the advantage that the integrated circuit of the power amplifier already provides an analogue sinusoidal output current at its first and second output pins and there is not need for external filter means. For each of the bits "0" and "1" a number of M digital wave-forming bit combinations of N bits drive driver means that generate increments of the substantial sinusoidal output current. The higher the numbers N and M the better the increments add up to form a smooth sinusoidal output current. The content of the M successive digital wave-forming bit combinations define the amplitude of the output signal of the digital power amplifier for the duration of one oscillation of the sinusoidal output signal.

These and other aspects of the invention will be apparent from and elucidated with reference to the embodiments described hereinafter. The person skilled in the art will understand that various embodiments may be combined.

DETAILED DESCRIPTION OF EMBODIMENTS

Figure 1:
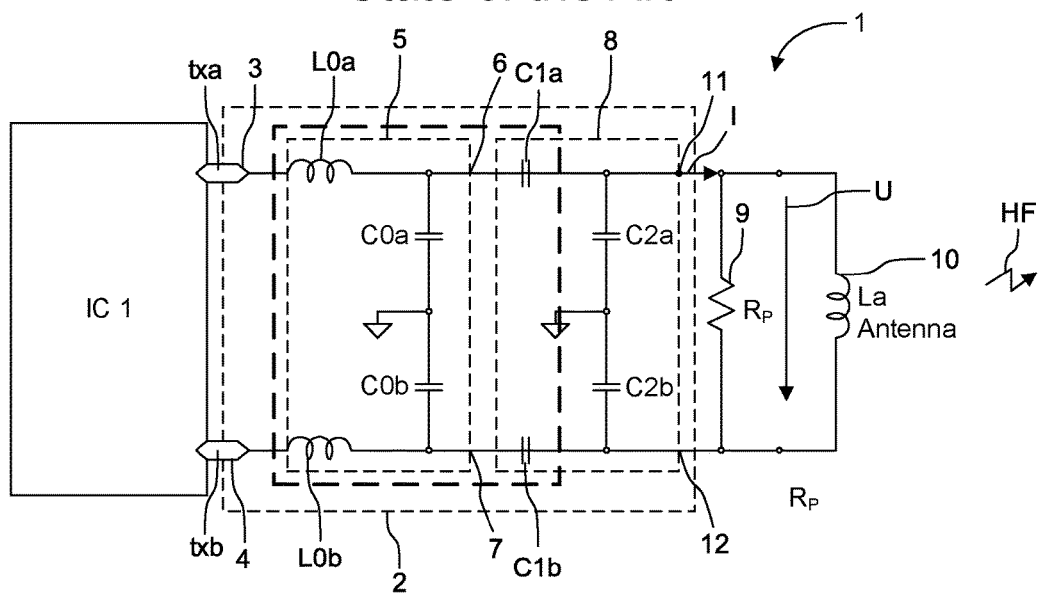
FIG. 1 shows a high-voltage digital power amplifier of a reader according to the state of the art.
Figure 2:
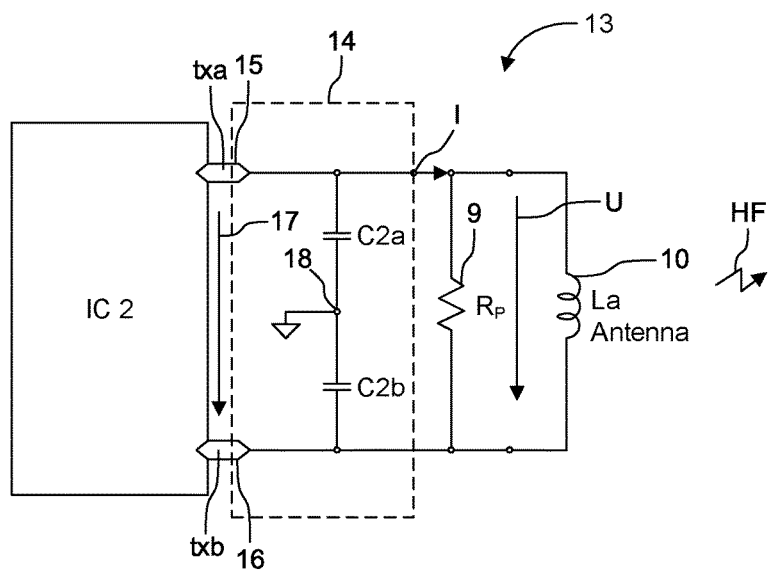
FIG. 2 shows a high-voltage digital power amplifier of a reader or tag according to the invention.

FIG. 2 shows the transmission part of a high-voltage digital power amplifier 13 within a reader or tag that comprises an integrated circuit IC2 that processes digital data to be transmitted to a reader or tag. An adaption circuit 14 of discrete components connected to a first transmission output pin 15 and a second transmission output pin 16 is built to adapt output signal 17 of the integrated circuit IC2 and feed a substantial sinusoidal output current I with a transmission resonance frequency to RFID antenna 10. The adaptation circuit 14 comprises a first resonance capacitor C2a connected with its first contact to the first transmission output pin 15 and a second resonance capacitor C2b connected with its first contact to the second transmission output pin 16 and both resonance capacitors C2a and C2b are connected with their second contacts to a ground pin 18 of the integrated circuit IC2. The resonance capacitors C2a and C2b are tuned to build a resonance system together with the output impedance of the integrated circuit IC2 at the first and second transmission output pins 15 and 16 and the impedance of the parallel connected Ohmic resistance 9 and RFID antenna 10 to resonate at the transmission resonance frequency of 13.56 MHz. This transmission resonance frequency of 13.56 MHz is defined in standard ISO/IEC 14.443 to transmit and receive data over the magnetic field HF.

Figure 3:
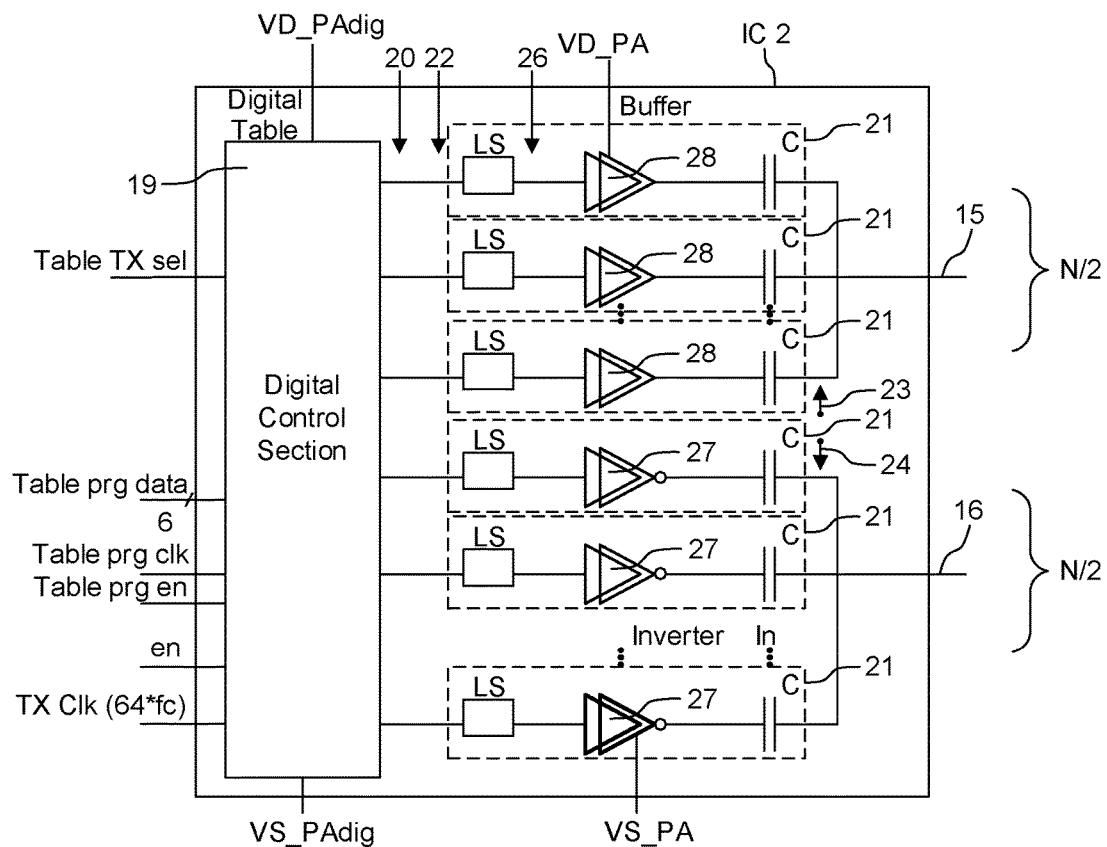
FIG. 3 shows part of the integrated circuit of the digital power amplifier according to FIG. 2.

FIG. 3 shows part of the integrated circuit IC2 of the digital power amplifier 13 according to FIG. 2. Integrated circuit IC2 comprises a digital control section 19 with a number of N wave-forming contacts 20 to output a digital wave-forming bit combination of N bits which changes with a clock frequency that is M-times the transmission resonance frequency. The clock frequency in this embodiment with M=64 is 64* 13.56 MHz=867.84 MHz. The number N defines the resolution or number of different amplitudes and the number M defines the resolution or split of one period of the substantial sinusoidal output current with its transmission resonance frequency of 13.56 MHz with which the digital power amplifier 13 drives the RFID antenna 10. In principle the higher the numbers N and M the better and smoother the form of the sinus SIN of the substantial sinusoidal output current I and substantial sinusoidal output voltage U. In the embodiment disclosed N=64 and M=64, but any other numbers may be used as well. M=64 provides a phase resolution of 360/64 degrees, about 6 degrees.

Figure 4:
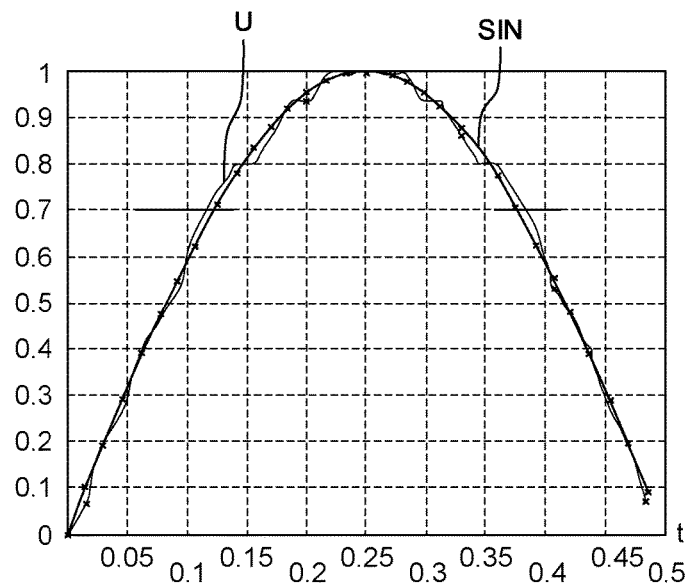
FIG. 4 shows an example of the substantial sinusoidal output voltage U over half a period of the transmission resonance frequency at the RFID antenna according to FIG. 2.
Figure 5:
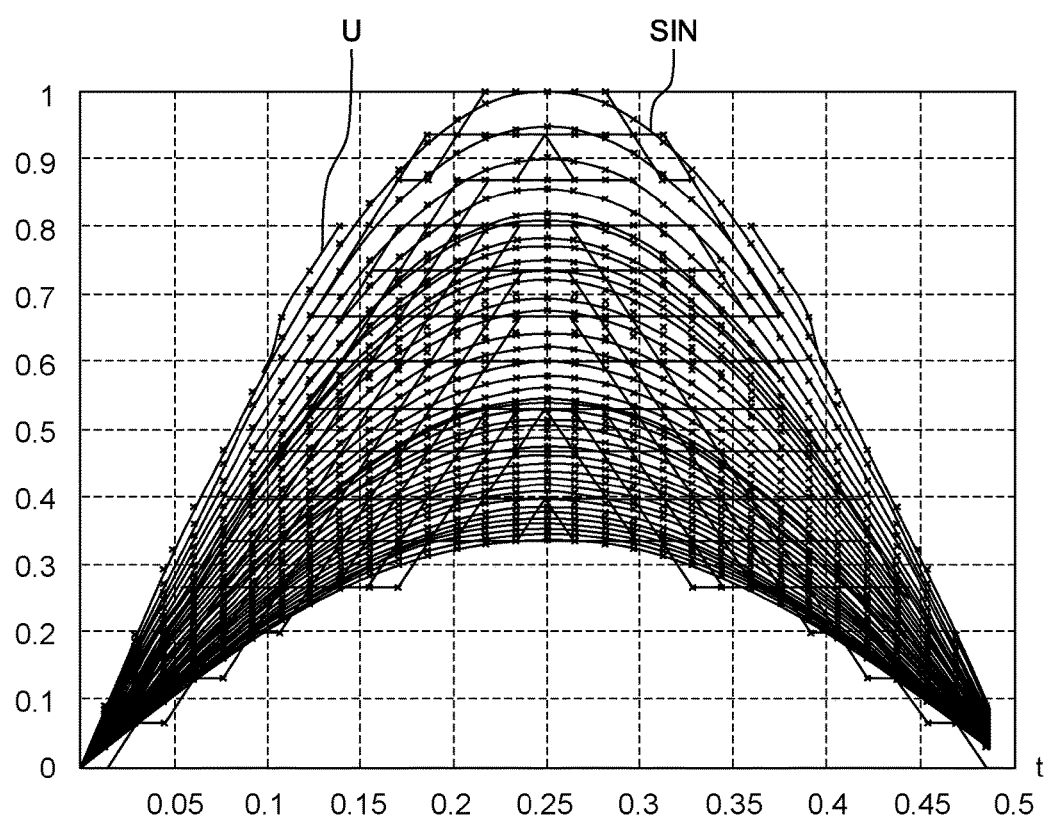
FIG. 5 shows an example of different amplitudes of the substantial sinusoidal output voltage U over half a period of the transmission resonance frequency at RFID antenna generated with different wave-forming bit combinations in the digital power amplifier according to FIG. 2.

FIG. 4 shows an example of the substantial sinusoidal output voltage U with maximal amplitude possible over half a period of the transmission resonance frequency at the RFID antenna 10 generated by the power amplifier 13 according to FIG. 2 in comparison with a perfect sinus SIN. Such resonant output voltage U may be in the 100 Voltage peak-to-peak range or even more. FIG. 5 shows the different amplitudes of the substantial sinusoidal output voltage U over half a period of the transmission resonance frequency at the RFID antenna 10 that may be generated by the power amplifier 13 according to FIG. 2 depending on the content of the M/2 digital wave-forming bit combinations of the N bits provided at the N wave-forming contacts 20 with the clock frequency of the integrated circuit IC2.

Digital control section 19 stores a table with a number of M digital wave-forming bit combinations for each of the data bits "0" and "1" and digital control section 19 is built to output the M digital wave-forming bit combinations of either data bit "0" or "1" at the N wave-forming contacts 20 to transform data bit "0" or "1" into the substantial sinusoidal output current I.

Each of the N driver blocks 21 is connected with a first contact 22 to one of the wave-forming contacts 20. N/2 of the driver blocks 21 are connected with a second contact 23 to the first transmission output pin 15 and the other N/2 of the driver blocks 21 are connected with their second contact 24 to the second transmission output pin 16, which driver blocks 21 are built to provide increments of the substantial sinusoidal output current I to the first and second transmission output pins 15 and 16. This means that each of the driver blocks 21, if driven with a bit "1" in the digital wave-forming bit combination, adds an increment of for instance 5 mA for one clock period to the transmission output pin 15 or 16. All these increments add up to form the substantial sinusoidal output current I with for instance maximal N*5 mA=320 mA. Higher or lower increments would be possible as well.

This design of integrated circuit IC2 comprises the advantage that the output signal 17 at the first and second transmission output pins 15 and 16 is already an analogue signal with a signal form close to a perfect sinus SIN to satisfy the spurious emission levels required by regulations to avoid noise in other frequency ranges. Therefore no external filter means are needed in the adaption means 14, compared to state of the art integrated circuit IC1. All discrete components in adaptation circuit 2 connected to integrated circuit IC1 are not needed in adaption means 14 connected to integrated circuit IC2. This saves printed circuit board space. Furthermore the RFID antenna 10 may be directly connected to the first and second transmission output pins 15 and 16. In addition it is advantageous that the waveform of the substantial sinusoidal output current I and voltage U may be digitally programmed to achieve accurate output power modulation.

Each driver block 21 comprises a level shifter LS connected to the first contact 22 of the driver block 21 to shift the voltage provided at the wave-forming contacts 20 to a higher and in particular to an at least a two times higher voltage. In the embodiment disclosed the level shifters LS receive an input signal in the range of 0 Volt to 1.8 Volt at their first contact 22 and shift it into an output signal in the range of 0 Volt to 5 Volt at their second contact 26. Level shifters LS therefore transform from the low-voltage domain VD_PAdig of the digital control section 19 into the high voltage analog domain VD_PA the driver blocks 21 are supplied with.

Each of the driver blocks 21 is either connected with its second contact 23 to the first transmission output pin 15 or with its other second contact 24 to the second transmission output pin 16. Those driver blocks 21 connected to the second transmission output pin 16 comprise an inverter 27 to invert the potential of the voltage provided by the level shifter LS. This enables to generate the negative half of the substantial sinusoidal output current I and output voltage U. Those driver blocks 21 connected to the first transmission output pin 15 comprise a buffer 28 to have similar influence on the output signal of the level shifter LS, but do not invert the potential of the voltage provided by the level shifter LS.

Each driver block 21 furthermore comprises a series capacitor C arranged either between the inverter 27 and the other second-contact 24 or between the buffer 28 and the second contact 23 of the driver block and fed with the voltage or inverted voltage of the level shifter LS, correspondingly. This enables that the current increments of each of the driver blocks 21 add up to a positive and a negative half wave of the substantial sinusoidal output current I. Typical capacity of capacitors C would be 10 pF each what sums up to 500 pF for the driver blocks 21 connected to the first transmission output pin 15 and what sums up to 500 pF for the driver blocks 21 connected the second transmission output pin 16. But each single capacitor C could have a lower capacity like 5 pF or 1 pF or a higher capacity like 20 pF or 50 pF than the example of 10 pF as well.

Integrated circuit IC2 is realized in CMOS technology and advantageously the series capacitors C are realized by Metal-Oxide-Metal capacitors that use the capacitive effect of the connecting lines within integrated circuit IC2. This enables a good integration of the series capacitors C within integrated circuit IC2 and allows high output voltage.

All driver blocks 21 are always conducting, even when no digital wave-forming bits are output at wave-forming contacts 20. This enables that resonance tuning is preserved and overvoltage on the driver blocks 21 is prevented. The number of driver blocks 21 used in combination with the pulse width of the digital wave forming bits defines the output power of the power amplifier 13.

In another embodiment series capacitors C could be realized outside of the integrated circuit within the adaptation means. Other transmission resonance frequencies may be realized as well.

A major advantage of the inventive high-power digital power amplifier is that it may be integrated in a tag or transponder as well as in a reader. This is only possible as the space needed on the printed circuit board is small.

The digital power amplifier as described above realizes a method to generate increments of current pulses to add them up into a substantial sinusoidal output current.

The digital power amplifier as described above is built to generate increments of current pulses to add them up into a substantial sinusoidal output current. A man skilled in the art will understand that this principle may be used as well to generate increments of voltage pulses with the length of one clock period to add them up into a substantial sinusoidal output voltage.

The invention claimed is:

1. A digital power amplifier for driving a radio frequency identification (RFID) antenna with a substantial sinusoidal output current, wherein the digital power amplifier comprises:
an integrated circuit including a first transmission output pin and a second transmission output pin, the integrated circuit configured to provide an output signal between the first transmission output pin and the second transmission output pin; and
an adaption circuit configured to adapt the output signal and feed the substantial sinusoidal output current with a transmission resonance frequency to the RFID antenna, wherein the integrated circuit comprises:
a digital control section including a number N of wave-forming contacts, each wave-forming contact providing a voltage, the digital control section configured to output a digital wave-forming bit combination of N bits with a clock frequency that is a number M-times the transmission resonance frequency, wherein N and M are integers and N is an even number greater than or equal to 2; and
N driver blocks each having a first contact and a second contact, the first contact connected only to one of the wave-forming contacts and N/2 of the N driver blocks connected with a respective second contact only to the first transmission output pin and the other N/2 of the N driver blocks connected with another respective second contact only to the second transmission output pin, wherein the N driver blocks are built to provide increments of the substantial sinusoidal output current to the first and second transmission output pins and wherein each of the N/2 driver blocks connected to the first transmission output pin is built identical and each of the other N/2 driver blocks connected to the second transmission output pin is built identical.

2. The digital power amplifier according to claim 1, wherein each of the N driver blocks includes a level shifter, the first contact of the driver block arranged to supply the voltage provided by the wave-forming contact to the level shifter, the level shifter configured to shift the voltage provided at the wave-forming contact to a higher voltage.

3. The digital power amplifier according to claim 2, wherein each of the respective second contacts of the other N/2 of the N driver blocks is connected to the second transmission output pin and each of the other N/2 of the N driver blocks includes an inverter, the inverter configured to invert the potential of the voltage provided by the level shifter.

4. The digital power amplifier according to claim 3, wherein each of the N driver blocks includes a series capacitor arranged between the inverter and the second contact of the driver block and fed by either the shifted voltage of the level shifter or an inverted voltage of the level shifter.

5. The digital power amplifier according to claim 4, wherein the integrated circuit is implemented in CMOS technology and wherein the series capacitors are Metal-Oxide-Metal capacitors that use the capacitive effect of connecting lines within the integrated circuit.

6. The digital power amplifier according to claim 1, wherein the adaption circuit comprises two resonance capacitors each having a first contact to the first transmission output pin or the second transmission output pin and a second contact connected to a ground pin.

7. The digital power amplifier according to claim 1, wherein the transmission resonance frequency of the RFID antenna is 13.56 MHz and the clock frequency is a multiple of the transmission resonance frequency and in particular 8-times, 16-times, 32-times or 64-times the transmission resonance frequency.

8. The digital power amplifier according to claim 1, wherein the digital control section stores M digital wave-forming bit combinations in a table for each of data bits "0" and "1" and wherein the digital control section is built to output the M digital wave-forming bit combinations of either data bit "0" or "1" at the N wave-forming contacts to transform data bits of "0" or "1" into the substantial sinusoidal output current.

* * * * *